(12) United States Patent
Huang et al.

(10) Patent No.: US 11,501,708 B2
(45) Date of Patent: Nov. 15, 2022

(54) PIXEL DRIVING CIRCUIT, DRIVING METHOD THEREOF AND DISPLAY PANEL

(71) Applicants: Chengdu BOE Optoelectronics Technology Co., Ltd., Chengdu (CN); BOE Technology Group Co., Ltd., Beijing (CN)

(72) Inventors: Yao Huang, Beijing (CN); Yue Long, Beijing (CN); Weiyun Huang, Beijing (CN); Benlian Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/355,822

(22) Filed: Jun. 23, 2021

(65) Prior Publication Data

US 2022/0165213 A1 May 26, 2022

(30) Foreign Application Priority Data

Nov. 25, 2020 (CN) .......................... 202011339467.0

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *G09G 3/3283* (2013.01);
(Continued)

(58) Field of Classification Search
CPC .......... G09G 3/32–3291; H01L 27/3241–3244
See application file for complete search history.

(56) References Cited

U.S. PATENT DOCUMENTS

| 2006/0022909 A1 | 2/2006 | Kwak et al. |
| 2006/0186832 A1 | 8/2006 | Osame et al. |
| (Continued) | | |

FOREIGN PATENT DOCUMENTS

| CN | 1737894 A | 2/2006 |
| CN | 101707044 A | 5/2010 |
| (Continued) | | |

OTHER PUBLICATIONS

CN 2020113394670 first office action.

*Primary Examiner* — Sanjiv D. Patel
(74) *Attorney, Agent, or Firm* — IPro, PLLC

(57) ABSTRACT

Provided are a pixel driving circuit, a driving method and a display panel. The pixel driving circuit includes a driving transistor, a storage sub-circuit, a data writing sub-circuit, an initialization sub-circuit, a first light-emission control sub-circuit, a second light-emission control sub-circuit and a light-emitting element. The data writing sub-circuit is configured to write a data signal to a first electrode of the driving transistor in response to a second scan signal. The storage sub-circuit is configured to store the data signal written by the data writing sub-circuit. The initialization sub-circuit is configured to apply a reset voltage of an initial voltage terminal to the light-emitting element in response to a first scan signal. The first light-emission control sub-circuit is configured to apply a voltage of a first power terminal to the first electrode of the driving transistor in response to a first light-emission signal.

20 Claims, 4 Drawing Sheets

(51) Int. Cl.
*G09G 3/3283* (2016.01)
*H01L 27/32* (2006.01)
*H01L 29/786* (2006.01)

(52) U.S. Cl.
CPC ............... *G09G 2300/0426* (2013.01); *G09G 2310/062* (2013.01); *G09G 2320/0233* (2013.01); *G09G 2320/0626* (2013.01); *H01L 27/3262* (2013.01); *H01L 29/78693* (2013.01)

(56) References Cited

U.S. PATENT DOCUMENTS

| | | | |
|---|---|---|---|
| 2014/0354522 A1* | 12/2014 | Chung | G09G 3/3233 345/82 |
| 2016/0180818 A1* | 6/2016 | Kim | G09G 3/3233 345/82 |
| 2018/0144681 A1* | 5/2018 | Xiang | G09G 3/3233 |
| 2018/0308427 A1 | 10/2018 | Zhang et al. | |
| 2021/0065632 A1* | 3/2021 | Kim | G09G 3/3275 |
| 2021/0366363 A1 | 11/2021 | Lee et al. | |

FOREIGN PATENT DOCUMENTS

| | | |
|---|---|---|
| CN | 103065584 A | 4/2013 |
| CN | 105336292 A | 2/2016 |
| CN | 106128360 A | 11/2016 |
| CN | 107464517 A | 12/2017 |
| CN | 108288454 A | 7/2018 |
| CN | 110176213 A | 8/2019 |
| CN | 110767251 A | 2/2020 |
| EP | 3279888 A1 | 2/2018 |

\* cited by examiner in the reset phase, applying, by the initialization sub-circuit in response to the first scan signal, the reset voltage of the initial voltage terminal to the light-emitting element, to reset a voltage of the first end of the light-emitting element, and applying, by the storage sub-circuit in response to the first light-emission signal, the reset voltage to the gate electrode of the driving transistor, to reset a voltage of the gate electrode of the driving transistor

in the data writing phase, writing, by the data writing sub-circuit in response to the second scan signal, the data signal into the first electrode of the driving transistor, the data signal being Vdata; controlling, by the storage sub-circuit in response to the first light-emission signal, a path between the second electrode and the gate electrode of the driving transistor to be electrically conducted, to enable a voltage of the gate electrode of the driving transistor to be Vdata+Vth and realize the writing of the data signal into the storage sub-circuit, where Vth is a threshold voltage corresponding to the driving transistor

in the light-emitting phase, applying, by the first light-emission control sub-circuit in response to the first light-emission signal, the voltage of the first power terminal to the first electrode of the driving transistor, and applying, by the second light-emission control sub-circuit in response to the second light-emission signal, the drive current to the light-emitting element, to drive the light-emitting element to emit light

FIG. 7

PIXEL DRIVING CIRCUIT, DRIVING METHOD THEREOF AND DISPLAY PANEL

CROSS-REFERENCE TO RELATED APPLICATION

This application claims a priority to Chinese Patent Application No. 202011339467.0 filed on Nov. 25, 2020, the disclosure of which is incorporated in its entirety by reference herein.

TECHNICAL FIELD

The present disclosure relates to the field of display technology, and in particular to a pixel driving circuit, a driving method thereof, and a display panel.

BACKGROUND

Organic light emitting diode (OLED) display devices have gradually gained popularity due to their advantages such as a wide viewing angle, a high contrast, a fast response speed, the higher luminous brightness and lower driving voltage as compared to inorganic light emitting display devices. Due to the above characteristics, organic light-emitting diodes (OLED) can be applied to devices with display functions such as mobile phones, displays, notebook computers, digital cameras, and instrumentations.

SUMMARY

In one aspect, the present disclosure provides a pixel driving circuit, which includes a driving transistor, a storage sub-circuit, a data writing sub-circuit, an initialization sub-circuit, a first light-emission control sub-circuit, a second light-emission control sub-circuit and a light-emitting element, where:

the data writing sub-circuit is connected to a first electrode of the driving transistor, and is configured to write a data signal to the first electrode of the driving transistor in response to a second scan signal;

the storage sub-circuit is connected to a gate electrode of the driving transistor, a second electrode of the driving transistor and an initial voltage terminal, and is configured to store the data signal written by the data writing sub-circuit;

the initialization sub-circuit is connected to the initial voltage terminal and a first end of the light-emitting element, and is configured to apply a reset voltage of the initial voltage terminal to the light-emitting element in response to a first scan signal;

the first light-emission control sub-circuit is connected to the first electrode of the driving transistor and a first power terminal, and is configured to apply a voltage of the first power terminal to the first electrode of the driving transistor in response to a first light-emission signal;

the driving transistor is configured to generate a drive current in response to the data signal stored in the gate electrode of the driving transistor by the storage sub-circuit, and under action of the voltage applied to the first electrode of the driving transistor by the first light-emission control sub-circuit; and the second light-emission control sub-circuit is connected to the second electrode of the driving transistor and the first end of the light-emitting element, and is configured to apply the drive current to the light-emitting element in response to a second light-emission signal, where a second end of the light-emitting element is connected to a second power terminal.

In some optional embodiments, the storage sub-circuit includes a storage capacitor and a first transistor, a first end of the storage capacitor is connected to the gate electrode of the driving transistor, and a second end of the storage capacitor is connected to the initial voltage terminal; and a gate electrode of the first transistor is connected to a first light-emission control line that provides the first light-emission signal, a first electrode of the first transistor is connected to the first end of the storage capacitor, and a second electrode of the first transistor is connected to the second electrode of the driving transistor.

In some optional embodiments, the data writing sub-circuit includes a second transistor, a gate electrode of the second transistor is connected to a second scan line that provides the second scan signal, a first electrode of the second transistor is connected to a data line that provides the data signal, and a second electrode of the second transistor is connected to the first electrode of the driving transistor.

In some optional embodiments, the initialization sub-circuit includes a third transistor, a gate electrode of the third transistor is connected to a first scan line that provides the first scan signal, a first electrode of the third transistor is connected to the initial voltage terminal to receive the reset voltage, and a second electrode of the third transistor is connected to the first end of the light-emitting element.

In some optional embodiments, the first light-emission control sub-circuit includes a fourth transistor, and the second light-emission control circuit includes a fifth transistor; a gate electrode of the fourth transistor is connected to a first light-emission control line that provides the first light-emission signal, a first electrode of the fourth transistor is connected to the first power terminal, and a second electrode of the fourth transistor is connected to the first electrode of the driving transistor; and a gate electrode of the fifth transistor is connected to a second light-emission control line that provides the second light-emission signal, a first electrode of the fifth transistor is connected to the second electrode of the driving transistor, and a second electrode of the fifth transistor is connected to the first end of the light-emitting element.

In some optional embodiments, the storage sub-circuit includes a storage capacitor and a first transistor, a first end of the storage capacitor is connected to the gate electrode of the driving transistor, and a second end of the storage capacitor is connected to the initial voltage terminal;

a gate electrode of the first transistor is connected to a first light-emission control line that provides the first light-emission signal, a first electrode of the first transistor is connected to the first end of the storage capacitor, and a second electrode of the first transistor is connected to the second electrode of the driving transistor;

the data writing sub-circuit includes a second transistor, a gate electrode of the second transistor is connected to a second scan line that provides the second scan signal, a first electrode of the second transistor is connected to a data line that provides the data signal, and a second electrode of the second transistor is connected to the first electrode of the driving transistor;

the initialization sub-circuit includes a third transistor, a gate electrode of the third transistor is connected to a first scan line that provides the first scan signal, a first electrode of the third transistor is connected to the initial voltage terminal to receive the reset voltage, and a second electrode of the third transistor is connected to the first end of the light-emitting element;

the first light-emission control sub-circuit includes a fourth transistor, and the second light-emission control circuit includes a fifth transistor; a gate electrode of the fourth transistor is connected to a first light-emission control line that provides the first light-emission signal, a first electrode of the fourth transistor is connected to the first power terminal, and a second electrode of the fourth transistor is connected to the first electrode of the driving transistor;

a gate electrode of the fifth transistor is connected to a second light-emission control line that provides the second light-emission signal, a first electrode of the fifth transistor is connected to the second electrode of the driving transistor, and a second electrode of the fifth transistor is connected to the first end of the light-emitting element;

the driving transistor, the second transistor, the third transistor, the fourth transistor and the fifth transistor are P-type transistors, and the first transistor is an N-type transistor.

In some optional embodiments, the storage sub-circuit further includes a sixth transistor, a gate electrode of the sixth transistor is connected to the first light-emission control line, a first electrode of the sixth transistor is connected to the second electrode of the first transistor, and a second electrode of the sixth transistor is connected to the second electrode of the driving transistor.

In some optional embodiments, the sixth transistor is an N-type transistor.

In some optional embodiments, the storage sub-circuit further includes a sixth transistor, a gate electrode of the sixth transistor is connected to a first scan line that provides the first scan signal, a first electrode of the sixth transistor is connected to the second electrode of the first transistor, and a second electrode of the sixth transistor is connected to the second electrode of the driving transistor.

In some optional embodiments, the sixth transistor is a P-type transistor.

In some optional embodiments, the first transistor is an indium gallium zinc oxide (IGZO) transistor.

In some optional embodiments, the first power terminal is inputted with a first DC (direct current) voltage, the second power terminal is inputted with a second DC voltage, and the second voltage is lower than the first voltage.

In another aspect, the present disclosure provides a driving method of a pixel driving circuit, applied to the pixel driving circuit according to any one of the above embodiments, the method includes: a reset phase, a data writing phase and a light-emitting phase:

in the reset phase, applying, by the initialization sub-circuit in response to the first scan signal, the reset voltage of the initial voltage terminal to the light-emitting element, to reset a voltage of the first end of the light-emitting element, and applying, by the storage sub-circuit in response to the first light-emission signal, the reset voltage to the gate electrode of the driving transistor, to reset a voltage of the gate electrode of the driving transistor;

in the data writing phase, writing, by the data writing sub-circuit in response to the second scan signal, the data signal into the first electrode of the driving transistor, the data signal being Vdata, where the driving transistor is turned on; controlling, by the storage sub-circuit in response to the first light-emission signal, a path between the second electrode and the gate electrode of the driving transistor to be electrically conducted, to enable a voltage of the gate electrode of the driving transistor to be Vdata+Vth and realize the writing of the data signal into the storage sub-circuit, where Vth is a threshold voltage corresponding to the driving transistor; and in the light-emitting phase, applying, by the first light-emission control sub-circuit in response to the first light-emission signal, the voltage of the first power terminal to the first electrode of the driving transistor, and applying, by the second light-emission control sub-circuit in response to the second light-emission signal, the drive current to the light-emitting element, to drive the light-emitting element to emit light.

In still another aspect, the present disclosure provides a display panel, including a plurality of pixel units arranged in an array, where each of the plurality of pixel units includes the pixel driving circuit according to any one of the above embodiments.

BRIEF DESCRIPTION OF THE DRAWINGS

By reading the detailed description of non-limiting embodiments with reference to the following drawings, other features, objectives and advantages of the present disclosure will become more apparent:

FIG. 7 is a flow chart of a driving method of a pixel driving circuit provided by some embodiments of the present disclosure.

DETAILED DESCRIPTION

Figure 1:
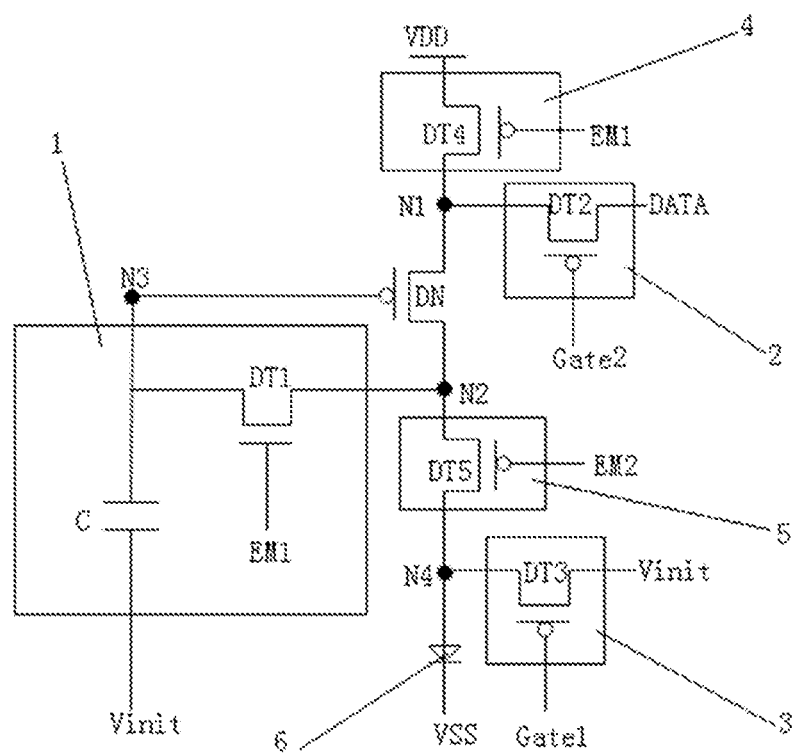
FIG. 1 is a schematic structural diagram of a pixel driving circuit provided by some embodiments of the disclosure.

The present disclosure will be further described in detail below with reference to the accompanying drawings and embodiments. It can be understood that the specific embodiments described herein are only used to explain the related invention, but not to limit the invention. In addition, it should be noted that, for ease of description, only the parts related to the present disclosure are shown in the drawings.

It should be noted that the embodiments in the present disclosure and the features in the embodiments can be combined with each other if there is no conflict. Hereinafter, the present disclosure will be described in detail with reference to the drawings and in conjunction with the embodiments.

Compared with LCD (Liquid Crystal Display) panels, OLED panels have the advantage of individual pixel control, which requires the design of a separate pixel control circuit for each pixel. The pixel control design is optimized on the basis of the relevant pixel circuit, individual control of each pixel, and corresponding parameter compensation are achieved based on the corresponding timing control.

In view of the above-mentioned defects or deficiencies in the related art, it is desirable to provide a pixel driving circuit, a driving method thereof, and a display panel, which can save wiring space.

Referring to FIG. 1, an embodiment of the present disclosure provides a pixel driving circuit, which includes a driving transistor DN, a storage sub-circuit 1, a data writing sub-circuit 2, an initialization sub-circuit 3, a first light-emission control sub-circuit 4, and a second light-emission control sub-circuit 5 and a light-emitting element 6.

The driving transistor DN is configured to control a drive current flowing between a first electrode and a second electrode of the driving transistor.

The data writing sub-circuit 2 is configured to write a data signal DATA to the first electrode of the driving transistor DN during a data writing phase. In specific settings, the data writing sub-circuit 2 is connected to the first electrode of the driving transistor DN, and is configured to write the data signal DATA into the first electrode of the driving transistor DN in response to a second scan signal Gate2.

The storage sub-circuit 1 is configured to reset a gate electrode of the driving transistor DN during the reset phase, and store the data signal DATA written by the data writing circuit 2 in a capacitor of the storage sub-circuit 1 during a data writing phase; and it is configured to keep the gate voltage of the driving transistor DN stable when the gate electrode of the driving transistor DN is floating. In specific settings, the storage sub-circuit 1 is connected to the gate electrode of the driving transistor DN, a second electrode of the driving transistor DN, and an initial voltage terminal Vinit, and is configured to store the data signal DATA written by the data writing circuit 2 into the driving transistor DN.

The initialization sub-circuit 3 is configured to reset an anode of the light-emitting element 6 during a reset phase. In specific settings, the initialization sub-circuit 3 is connected to the initial voltage terminal Vinit and a first end of the light-emitting element 6, and is configured to apply a reset voltage to the light-emitting element 6, in response to a first scan signal Gate1.

The first light-emission control sub-circuit 4 is configured to provide a power voltage to the first electrode of the driving transistor DN during a light-emitting phase. In specific settings, the first light-emission control sub-circuit 4 is connected to the first electrode of the driving transistor DN and a power supply terminal VDD, and is configured to apply a voltage of the first power supply terminal VDD to the first electrode of the driving transistor DN, in response to a first light-emission signal EM1.

The second light-emission control sub-circuit 5 is configured to control a path between a first end of the light-emitting element 6 and the second electrode of the driving transistor DN to be electrically conducted during the reset phase and the light-emitting phase. In specific settings, the second light-emission control sub-circuit 5 is connected to the second electrode of the driving transistor DN, and the first end of the light-emitting element 6, and is configured to apply the drive current to the light-emitting element 6, in response to a second light-emission signal EM2. A second end of the light-emitting element 6 is connected to a second power supply terminal VSS.

The transistors may be independently selected from one of polysilicon thin film transistors, amorphous silicon thin film transistors, oxide thin film transistors, and organic thin film transistors. The "control electrode" specifically refers to a gate electrode of a transistor, the "first electrode" specifically refers to the source electrode of the transistor, and the "second electrode" specifically refers to the drain electrode of the transistor. Of course, those skilled in the art should know that the "first electrode" and "second electrode" can be interchanged, that is, the "first electrode" specifically refers to the drain electrode of the transistor, and the "second electrode" specifically refers to the source electrode of the transistor.

In addition, according to different semiconductor characteristics of transistors, transistors can be divided into N-type transistors and P-type transistors. When a transistor is used, the N-type transistor is turned on under control of a high-level control signal (for example, 5V, 10V or other suitable voltage), and turned off under control of a low-level control signal; P-type transistor is turned on under control of a low-level control signal (for example, 0V, −5V, −10V or other suitable voltages), and turned off under control of a high-level control signal.

In order to reduce the power consumption of OLEDs, low-frequency signals can be used to drive a pixel circuit. However, when the pixel circuit is implemented with all P-type transistors, due to the relatively large leakage current of the P-type transistors, low-frequency driving may cause flicker and similar phenomenon, which limits the use of the pixel circuit. In some embodiments of the present disclosure, the pixel circuit may use both N-type and P-type transistors, which can overcome the flickering phenomenon when the pixel circuit is used for low-frequency driving.

In addition, since the first transistor of the storage sub-circuit 1 in the pixel driving circuit adopts a smaller-sized N-type transistor with a low leakage current, the capacitor C of the compensation circuit may be a smaller-sized capacitor, which can increase the resolution of the display panel. Meanwhile, since the leakage current of the N-type transistor is low, there is no need to consider the aging problem of the N-type transistor.

The present disclosure provides a driving method of a pixel driving circuit, which is applied to the pixel driving circuit as described in any one of the above embodiments, and the driving method includes a reset phase, a data writing phase, and a light-emitting phase. As shown in FIG. 7, the method includes:

in the reset phase, applying, by the initialization sub-circuit in response to the first scan signal, the reset voltage of the initial voltage terminal to the light-emitting element, to reset a voltage of the first end of the light-emitting element; and applying, by the storage sub-circuit in response to the first light-emission signal, the reset voltage to the gate electrode of the driving transistor, to reset a voltage of the gate electrode of the driving transistor;

in the data writing phase, writing, by the data writing sub-circuit in response to the second scan signal, the data signal into the first electrode of the driving transistor, the data signal being Vdata; controlling, by the storage sub-circuit in response to the first light-emission signal, a path between the second electrode and the gate electrode of the driving transistor to be electrically conducted, to enable a voltage of the gate electrode of the driving transistor to be Vdata+Vth and realize writing of the data signal into the storage sub-circuit, where Vth is a threshold voltage corresponding to the driving transistor; and in the light-emitting phase, applying, by the first light-emission control sub-circuit in response to the first light-emission signal, the voltage of the first power terminal to the first electrode of the driving transistor, and applying, by the second light-emission control sub-circuit in response to the second light-emission signal, the drive current to the light-emitting element, to drive the light-emitting element to emit light.

As shown in FIG. 1, some embodiments of the present disclosure provide a pixel driving circuit, including a driving transistor DN, a storage sub-circuit 1, a data writing sub-circuit 2, an initialization sub-circuit 3, a first light-emission control sub-circuit 4, a second light-emission control sub-circuit 5 and a light-emitting element 6.

The storage sub-circuit 1 includes a storage capacitor C and a first transistor DT1, a first end of the storage capacitor C is connected to a gate electrode of the driving transistor DN, and a second end of the storage capacitor C is connected to an initial voltage terminal Vinit. A gate electrode of the first transistor DT1 is connected to a first light-emission control line that provides a first light-emission signal EM1, a first electrode of the first transistor DT1 is connected to the first end of the storage capacitor C, and a second electrode of the first transistor DT1 is connected to the second electrode of the driving transistor DN.

The data writing sub-circuit 2 includes a second transistor DT2. A gate electrode of the second transistor DT2 is connected to a second scan line that provides a second scan signal Gate2. A first electrode of the second transistor DT2 is connected to the data line. A second electrode of the second transistor DT2 is connected to the first electrode of the driving transistor DN.

The initialization sub-circuit 3 includes a third transistor DT3, a gate electrode of the third transistor DT3 is connected to the first scan line, a first electrode of the third transistor DT3 is connected to the initial voltage terminal Vinit to receive a reset voltage, and a second electrode of the third transistor DT3 is connected to a first end of the light-emitting element 6.

The first light-emission control sub-circuit 4 includes a fourth transistor DT4, and the second light-emission control sub-circuit 5 includes a fifth transistor DT5. A gate electrode of the fourth transistor DT4 is connected to the first light-emission control line that provides a first light-emission signal EM1, a first electrode of the fourth transistor DT4 is connected to a first power supply terminal VDD, and a second electrode of the fourth transistor DT4 is connected to the first electrode of the driving transistor DN. A gate electrode of the fifth transistor DT5 is connected to a second light-emission control line that provides a second light-emission control signal EM2, a first electrode of the fifth transistor DT5 is connected to the second electrode of the driving transistor DN, and a second electrode of the fifth transistor DT5 is connected to the first end of the light-emitting element 6.

In an optional embodiment, the driving transistor DN, the second transistor DT2, the third transistor DT3, the fourth transistor DT4 and the fifth transistor DT5 are P-type transistors, and the first transistor DT1 is an N-type transistor.

It should be noted that the light-emitting element 6 may be various types of OLEDs, such as top-emission type, bottom-emission type, double-side emission type, etc., which may emit red light, green light, blue light, or white light, which is not limited in the embodiments of the present disclosure.

It should be noted that the first power terminal VDD in the embodiments of the present disclosure, for example, keeps inputting a DC (direct current) high level signal, and this DC high level is referred to as a first voltage; the second power terminal VSS, for example, keeps inputting a DC low level signal, and the DC low level signal is referred to as a second voltage, which is lower than the first voltage. The following embodiments also apply the same concepts, which will not be repeated herein.

Furthermore, the first electrode of the driving transistor DN and the data writing sub-circuit 2 may be connected at a first node N1, the second electrode of the driving transistor DN and the second light-emission control sub-circuit 5 may be connected at a second node N2, a gate electrode of the driving transistor DN and the storage sub-circuit 1 may be connected at a third node N3, and the initializing sub-circuit 3 and the first end of the light-emitting element 6 may be connected at a fourth node N4.

It should be noted that in the description of the embodiments of the present disclosure, the first node N1, the second node N2, the third node N3, and the fourth node N4 do not represent actual components, but represent a convergence point showing related circuit connections in a circuit diagram, just to facilitate description and understanding.

Figure 2:
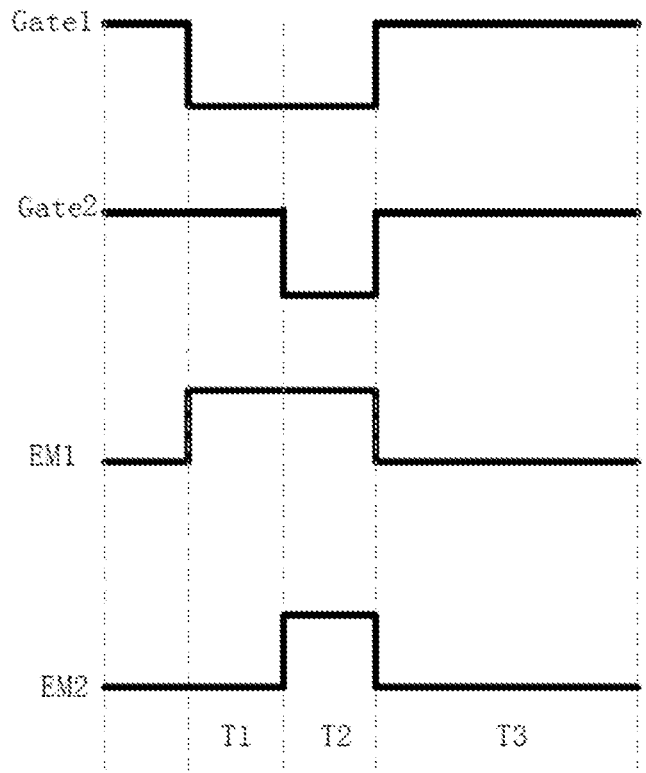
FIG. 2 is a working timing diagram of a structure of the pixel driving circuit shown in FIG. 1.

It should be noted that, in the embodiments of the present disclosure, the reset phase, the data writing phase, and the light-emitting phase are phases that occur sequentially, and the corresponding input timing is shown in FIG. 2.

The working process of the pixel circuit provided by the embodiments of the present disclosure includes the following phases:

In the T1 phase (reset phase), Gate1=0, Gate2=1, EM1=1, EM2=0; the first transistor DT1, the third transistor DT3 and the fifth transistor DT5 are turned on, and Vinit resets both a voltage at the third node N3 and a voltage at the fourth node N4. At this time, the fourth transistor DT4 and the second transistor DT2 are turned off, and the first node N1 is in a floating state (floating). Therefore, the voltage at the first node N1 may be discharged towards the initialization signal terminal Vinit until the voltage of the first node N1 changes to Vinit-Vth, and in this time, the driving transistor DN is turned off and in the cut-off state. The voltage of the third node N3 is Vint, and the voltage of the first node N1 is Vint-Vth.

It should be noted that Gate1=0 represents a low level, and Gate1=1 represents a high level.

Based on the foregoing technical solutions, it can be seen that the pixel circuit provided by the embodiments of the present disclosure can use the initialization sub-circuit 3 at the first end of the light-emitting element 6 to reset the third node N3, when the pixel circuit is operating in the reset phase, so there is no need to additionally configure an independent reset voltage input terminal for resetting the third node N3, which is beneficial to simplify the circuit structure and reduce the overall size of the pixel circuit. In the initialization phase, the capacitor C is reset to discharge the voltage stored in the capacitor C, so that the data signal DATA in the subsequent phase can be stored into the capacitor C more quickly and reliably.

In the T2 phase (data writing phase), Gate1=0, Gate2=0, EM1=1, EM2=1; the first transistor DT1 and the second transistor DT2 are turned on, Data charges the first node N1, and a voltage at the first node N1 is Vdata. The driving transistor DN is turned on, a voltage of the third node N3 is charged to N3=Vdata+Vth, the writing of the data signal DATA is realized, and the threshold voltage Vth of the driving transistor DN is locked.

It should be noted that Vdata represents a voltage value of the data signal DATA, and Vth represents the threshold voltage of the first transistor DT1. After the data writing phase T2, potentials of the second node N2 and the third node N3 are both Vdata+Vth. That is to say, voltage information about the data signal DATA and the threshold voltage Vth is stored in the capacitor C, for use in the subsequent light-emitting phase to provide gray scale display data and compensate the threshold voltage of the first transistor DT1.

In addition, it should be noted that in this phase, the initialization sub-circuit 3 may also be turned on or off in response to other signals, which will not affect the subsequent light-emitting phase of the pixel circuit, and is not limited in the embodiments of the present disclosure.

In the T3 phase (light-emitting phase), Gate1=1, Gate2=1, EM1=0, EM2=0; the fourth transistor DT4 and the fifth transistor DT5 are turned on, and the power voltage of the first power voltage terminal VDD is transmitted to the first node N1 via the turned-on four-transistor DT4, the voltage of the first node N1 becomes VDD, and the voltage of the third node N3 is still N3=Vdata+Vth, so in this phase, the driving transistor DN is also kept turning on.

The driving transistor DN works in a saturated state. According to current characteristics of the saturated state, a saturation current I flowing through the driving transistor DN and used to drive the light-emitting element 6 to emit light satisfies the formula:

$$I = \frac{1}{2} * \mu * Cox * \frac{W}{L} * (Vgs - Vth)^2 =$$
$$K * (Vdata + Vth - VDD - Vth)^2 = K * (Vdata - VDD)^{\wedge}2,$$

where K is a structural parameter. In the same structure, a value of K keeps relatively stable and may be counted as a constant. It can be seen that the operating current of the light-emitting element 6 is not affected by the threshold voltage Vth of the driving transistor DN, which solves the drift of the threshold voltage Vth of the driving transistor DN caused by the process and long-term operation, thereby improving the display inhomogeneity of the display panel.

Figure 3:
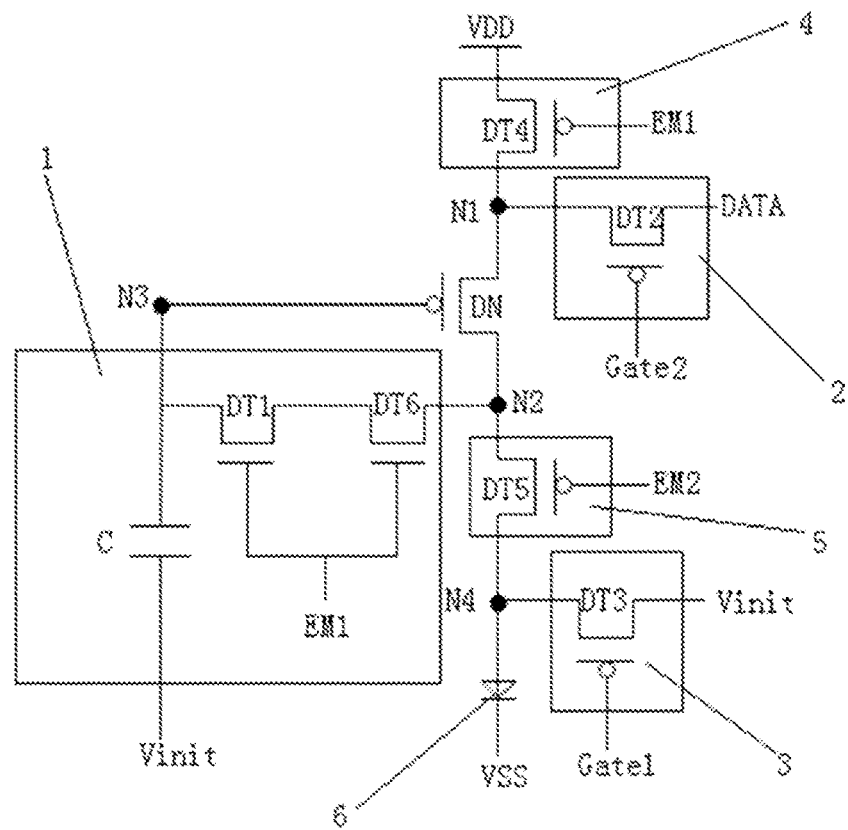
FIG. 3 is a schematic structural diagram of a pixel driving circuit provided by some other embodiments of the present disclosure.

Referring to FIG. 3, some other embodiments of the present disclosure provide a pixel driving circuit, including a driving transistor DN, a storage sub-circuit 1, a data writing sub-circuit 2, an initialization sub-circuit 3, a first light-emission control sub-circuit 4, a second light-emission control sub-circuit 5 and a light-emitting element 6.

The storage sub-circuit 1 includes a storage capacitor C, a first transistor DT1, and a sixth transistor DT6. A first end of the storage capacitor C is connected to a gate electrode of the driving transistor DN, and a second end of the storage capacitor C is connected to the initial voltage terminal Vinit. A gate electrode of the first transistor DT1 is connected to a first light-emission control line that provides the first light-emission signal EM1, a first electrode of the first transistor DT1 is connected to the first end of the storage capacitor C, and a second electrode of a transistor DT1 is connected to a first electrode of the sixth transistor DT6. A second electrode of the sixth transistor DT6 is connected to the second electrode of the driving transistor DN, and a gate electrode of the sixth transistor DT6 is connected to the first light-emission control line.

The first transistor DT1 and the sixth transistor DT6 are N-type transistors, as shown in FIG. 3. The leakage of the third node N3 can be further reduced by adding the sixth transistor in the storage sub-circuit. The data writing sub-circuit 2 includes a second transistor DT2. A gate electrode of the second transistor DT2 is connected to a second scan line that provides a second scan signal Gate2. A first electrode of the second transistor DT2 is connected to the data line. A second electrode of the second transistor DT2 is connected to the first electrode of the driving transistor DN.

The initialization sub-circuit 3 includes a third transistor DT3, a gate electrode of the third transistor DT3 is connected to the first scan line, a first electrode of the third transistor DT3 is connected to the initial voltage terminal Vinit to receive the reset voltage, and a second electrode of the third transistor DT3 is connected to the first end of the light-emitting element 6. The first light-emission control sub-circuit 44 includes a fourth transistor DT4, the second light-emission control circuit 5 includes a fifth transistor DT5. A gate electrode of the fourth transistor DT4 is connected to the first light-emission control line that provides a first light-emission signal EM1, a first electrode of the fourth transistor DT4 is connected to a first power supply terminal VDD, and a second electrode of the fourth transistor DT4 is connected to the first electrode of the driving transistor DN. A gate electrode of the fifth transistor DT5 is connected to a second light-emission control line that provides a second light-emission control signal EM2, a first electrode of the fifth transistor DT5 is connected to the second electrode of the driving transistor DN, and a second electrode of the fifth transistor DT5 is connected to the first end of the light-emitting element 6.

Figure 4:
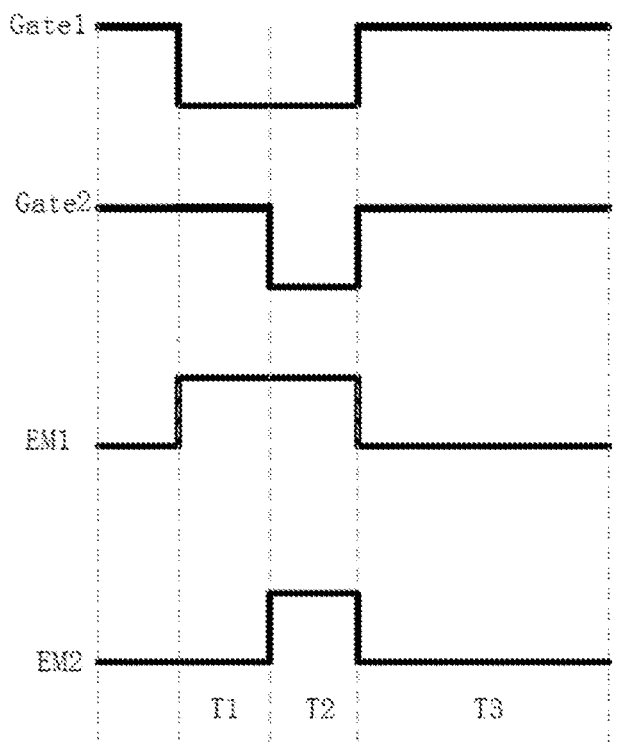
FIG. 4 is a working timing diagram of a structure of the pixel driving circuit shown in FIG. 2.

It should be noted that, in the embodiments of the present disclosure, the reset phase, the data writing phase, and the light-emitting phase occur in sequence, and the corresponding input timing is shown in FIG. 4.

The operating process of the pixel circuit provided by the embodiments of the present disclosure includes the following phases:

in the T1 phase (reset phase), Gate1=0, Gate2=1, EM1=1, EM2=0; the first transistor DT1, the third transistor DT3, the fifth transistor DT5, and the sixth transistor DT6 are turned on, and Vinit resets both a voltage at the third node N3 and a voltage at the fourth node N4. At this time, the fourth transistor DT4 and the second transistor DT2 are turned off, and the first node N1 is in a floating state (floating). Therefore, the voltage at the first node N1 may be discharged towards the initialization signal terminal Vinit until the voltage of the first node N1 changes to Vinit-Vth, and in this time, the driving transistor DN is turned off and in the cut-off state. The voltage of the third node N3 is Vint, and the voltage of the first node N1 is Vint-Vth.

It should be noted that Gate1=0 represents a low level, and Gate1=1 represents a high level.

In an optional embodiment, the driving transistor DN, the second transistor DT2, the third transistor DT3, the fourth transistor DT4, and the fifth transistor DT5 are P-type transistors, and the first transistor DT1 and the sixth transistor DT6 are N-type transistors.

Based on the foregoing technical solutions, it can be seen that the pixel circuit provided by the embodiments of the present disclosure can use the initialization sub-circuit 3 at the first end of the light-emitting element 6 to reset the third node N3, when the pixel circuit is operating in the reset phase. Therefore, there is no need to additionally configure an independent reset voltage input terminal for resetting the third node N3, which is beneficial to simplify the circuit structure and reduce the overall size of the pixel circuit. In the initialization phase, the capacitor C is reset to discharge the voltage stored in the capacitor C, so that the data signal DATA in the subsequent phase can be stored into the capacitor C more quickly and reliably.

In the T2 phase (data writing phase), Gate1=0, Gate2=0, EM1=1, EM2=1; the first transistor DT1, the second transistor DT2, and the sixth transistor DT6 are turned on, Data charges the first node N1, and a voltage at the first node N1 is Vdata. The driving transistor DN is turned on, a voltage of the third node N3 is charged to N3=Vdata+Vth, the writing of the data signal DATA is realized, and the threshold voltage Vth of the driving transistor DN is locked.

It should be noted that Vdata represents a voltage value of the data signal DATA, and Vth represents the threshold voltage of the first transistor DT1. After the data writing phase T2, potentials of the second node N2 and the third node N3 are both Vdata+Vth. That is to say, voltage information about the data signal DATA and the threshold voltage Vth is stored in the capacitor C, for use in the subsequent light-emitting phase to provide gray scale display data and compensate the threshold voltage of the first transistor DT1.

In addition, it should be noted that in this phase, the initialization sub-circuit 3 may also be turned on or off in response to other signals, which will not affect the subsequent light-emitting phase of the pixel circuit, and is not limited in the embodiments of the present disclosure.

In the T3 phase (light-emitting phase), Gate1=1, Gate2=1, EM1=0, EM2=0; the fourth transistor DT4 and the fifth transistor DT5 are turned on, and the power voltage of the first power voltage terminal VDD is transmitted to the first node N1 via the turned-on four-transistor DT4, the voltage of the first node N1 becomes VDD, and the voltage of the third node N3 is still N3=Vdata+Vth, so in this phase, the driving transistor DN is also kept turning on.

The driving transistor DN works in a saturated state. According to current characteristics of the saturated state, a saturation current I flowing through the driving transistor DN and used to drive the light-emitting element 6 to emit light satisfies the formula:

$$I = \frac{1}{2} * \mu * Cox * \frac{W}{L} * (Vgs - Vth)^2 = K * (Vdata + Vth - VDD - Vth)^2 = K * (Vdata - VDD)^{\wedge}2,$$

where K is a structural parameter. In the same structure, a value of K keeps relatively stable and may be counted as a constant. It can be seen that the operating current of the light-emitting element 6 is not affected by the threshold voltage Vth of the driving transistor DN, which solves the drift of the threshold voltage Vth of the driving transistor DN caused by the process and long-term operation, thereby improving the display inhomogeneity of the display panel.

Figure 5:
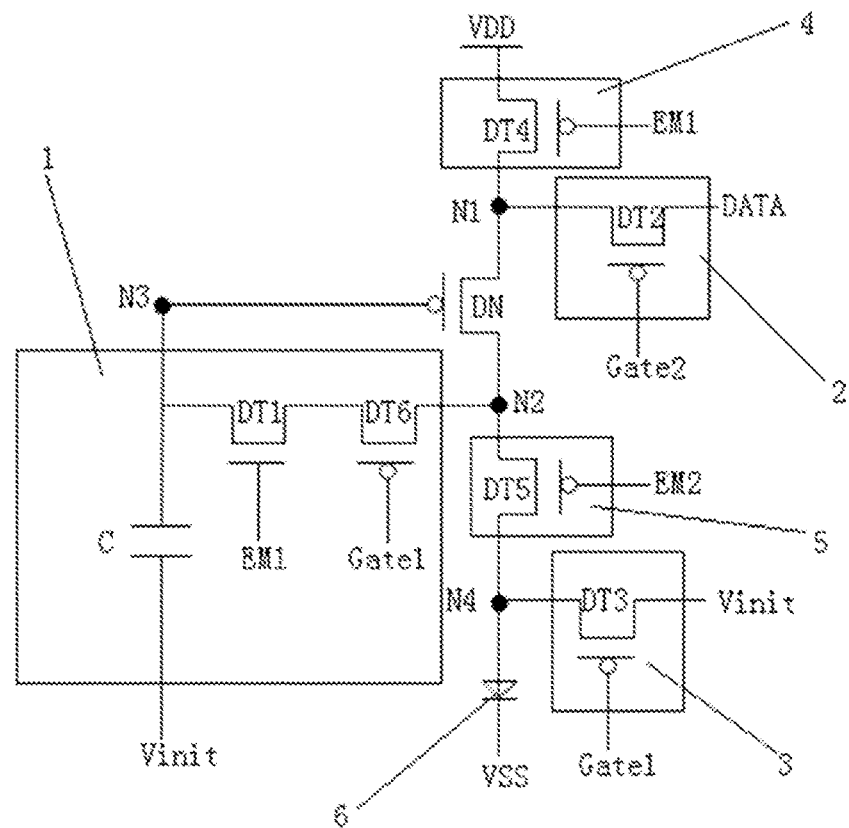
FIG. 5 is a schematic structural diagram of a pixel driving circuit provided by other embodiments of the disclosure.

Referring to FIG. 5, some other embodiments of the present disclosure provide a pixel driving circuit, including a driving transistor DN, a storage sub-circuit 1, a data writing sub-circuit 2, an initialization sub-circuit 3, a first light-emission control sub-circuit 4, a second light-emission control sub-circuit 5 and a light-emitting element 6.

The storage sub-circuit 1 includes a storage capacitor C, a first transistor DT1, and a sixth transistor DT6. A first end of the storage capacitor C is connected to a gate electrode of the driving transistor DN, and a second end of the storage capacitor C is connected to the initial voltage terminal Vinit. A gate electrode of the first transistor DT1 is connected to a first light-emission control line that provides the first light-emission signal EM1, a first electrode of the first transistor DT1 is connected to the first end of the storage capacitor C, and a second electrode of the first transistor DT1 is connected to a first electrode of the sixth transistor DT6. A second electrode of the sixth transistor DT6 is connected to the second electrode of the driving transistor DN, and a gate electrode of the sixth transistor DT6 is connected to a first scan line that provides the scan signal Gate1.

The first transistor is an N-type transistor, and the driving transistor DN, the second transistor DT2, the third transistor DT3, the fourth transistor DT4, the fifth transistor DT5, and the sixth transistor DT6 are all P-type transistors. In specific settings, the first transistor DT1 may be optionally configured as an IGZO transistor, and the sixth transistor DT6 may be optionally configured as a thin film transistor (LTPS) whose active layer is low-temperature doped polysilicon.

It should be noted that a PWM (Pulse Width Modulation) mode can be realized by connecting the first scan line to a gate electrode of the sixth transistor. PWM is a very effective mode to control the analog circuit by using digital output of a microprocessor. Through the first scan line Gate1 and the first light-emission signal EM1, these two signals line modulates a pulse width of the storage sub-circuit at the same time to realize the PWM mode.

IGZO (indium gallium zinc oxide) is an amorphous oxide containing indium, gallium and zinc. The carrier mobility of IGZO is 20-30 times that of amorphous silicon, which can greatly increase the charge and discharge rate of TFT to the pixel electrode, improve the pixel response speed, and achieve the faster refresh rate. The faster response also greatly improves a scan rate for a row of pixels, making ultra-high resolution possible in TFT-LCD. In addition, because the number of transistors is reduced, and the light transmittance of each pixel is increased, the IGZO display has a higher energy efficiency level and a higher efficiency.

It should be further noted that when an N-type transistor used, IGZO is used as the active layer of thin film transistor, which can effectively reduce the size of a transistor and prevent leakage current, as compared with the use of LTPS (Low Temperature Poly Silicon) or amorphous silicon (such as hydrogenated amorphous silicon) as the active layer of a thin film transistor. Therefore, the pixel circuit is applicable to low-frequency driving, and the resolution of the display panel can further be increased.

The data writing sub-circuit 2 includes a second transistor DT2. A gate electrode of the second transistor DT2 is connected to a second scan line that provides a second scan signal Gate2. A first electrode of the second transistor DT2 is connected to the data line. A second electrode of the second transistor DT2 is connected to the first electrode of the driving transistor DN.

The initialization sub-circuit 3 includes a third transistor DT3, a gate electrode of the third transistor DT3 is connected to the first scan line, a first electrode of the third transistor DT3 is connected to the initial voltage terminal Vinit to receive a reset voltage, and a second electrode of the third transistor DT3 is connected to a first end of the light-emitting element 6.

The first light-emission control sub-circuit 4 includes a fourth transistor DT4, and the second light-emission control sub-circuit 5 includes a fifth transistor DT5. A gate electrode of the fourth transistor DT4 is connected to the first light-emission control line that provides a first light-emission signal EM1, a first electrode of the fourth transistor DT4 is connected to a first power supply terminal VDD, and a second electrode of the fourth transistor DT4 is connected to the first electrode of the driving transistor DN. A gate electrode of the fifth transistor DT5 is connected to a second light-emission control line that provides a second light-emission control signal EM2, a first electrode of the fifth transistor DT5 is connected to the second electrode of the driving transistor DN, and a second electrode of the fifth transistor DT5 is connected to the first end of the light-emitting element 6.

In an optional embodiment, each of the second transistor DT2, the third transistor DT3, the fourth transistor DT4, and the fifth transistor DT5 may be optionally configured as a thin film transistor whose active layer is low-temperature doped polysilicon.

Figure 6:
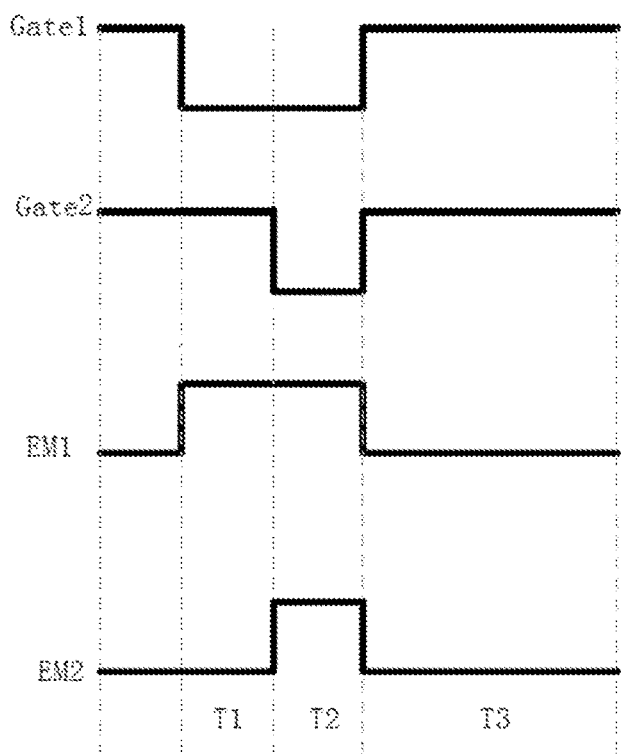
FIG. 6 is a working timing diagram of a structure of the pixel driving circuit shown in FIG. 5.

It should be noted that, in the embodiments of the present disclosure, the reset phase, the data writing phase, and the light-emitting phase are phases that occur successively, and the corresponding input timing is shown in FIG. 6.

The working process of the pixel circuit provided by the embodiments of the present disclosure includes the following phases:

in the T1 phase (reset phase), Gate1=0, Gate2=1, EM1=1, EM2=0; the first transistor DT1, the third transistor DT3, the fifth transistor DT5, and the sixth transistor DT6 are turned on, and Vinit resets both a voltage at the third node N3 and a voltage at the fourth node N4. At this time, the fourth transistor DT4 and the second transistor DT2 are turned off, and the first node N1 is in a floating state (floating). Therefore, the voltage at the first node N1 may be discharged towards the initialization signal terminal Vinit until the voltage of the first node N1 changes to Vinit-Vth, and in this time, the driving transistor DN is turned off and in the cut-off state. The voltage of the third node N3 is Vint, and the voltage of the first node N1 is Vint-Vth.

Based on the foregoing technical solutions, it can be seen that the pixel circuit provided by the embodiments of the present disclosure can use the initialization sub-circuit 3 at the first end of the light-emitting element 6 to reset the third node N3, when the pixel circuit is operating in the reset phase. Therefore, there is no need to additionally configure an independent reset voltage input terminal for resetting the third node N3, which is beneficial to simplify the circuit structure and reduce the overall size of the pixel circuit. In the initialization phase, the capacitor C is reset to discharge the voltage stored in the capacitor C, so that the data signal DATA in the subsequent phase can be stored into the capacitor C more quickly and reliably.

In the T2 phase (data writing phase), Gate1=0, Gate2=0, EM1=1, EM2=1; the first transistor DT1, the second transistor DT2, and the sixth transistor DT6 are turned on, Data charges the first node N1, and a voltage at the first node N1 is Vdata. The driving transistor DN is turned on, a voltage of the third node N3 is charged to N3=Vdata+Vth, the writing of the data signal DATA is realized, and the threshold voltage Vth of the driving transistor DN is locked.

It should be noted that Vdata represents a voltage value of the data signal DATA, and Vth represents the threshold voltage of the first transistor DT1. After the data writing phase T2, potentials of the second node N2 and the third node N3 are both Vdata+Vth. That is to say, voltage information about the data signal DATA and the threshold voltage Vth is stored in the capacitor C, for use in the subsequent light-emitting phase to provide gray scale display data and compensate the threshold voltage of the first transistor DT1.

In addition, it should be noted that in this phase, the initialization sub-circuit 3 may also be turned on or off in response to other signals, which will not affect the subsequent light-emitting phase of the pixel circuit, and is not limited in the embodiments of the present disclosure.

In the T3 phase (light-emitting phase), Gate1=1, Gate2=1, EM1=0, EM2=0; the fourth transistor DT4 and the fifth transistor DT5 are turned on, and the power voltage of the first power voltage terminal VDD is transmitted to the first node N1 via the turned-on four-transistor DT4, the voltage of the first node N1 becomes VDD, and the voltage of the third node N3 is still N3=Vdata+Vth, so in this phase, the driving transistor DN is also kept turning on.

The driving transistor DN works in a saturated state. According to current characteristics of the saturated state, a saturation current I flowing through the driving transistor DN and used to drive the light-emitting element 6 to emit light satisfies the formula:

$$I=\frac{1}{2}*\mu*Cox*W/L*(Vgs-Vth)^2=K*(Vdata+Vth-VDD-Vth)^2=K*(Vdata-VDD)^2,$$

where K is a structural parameter. In the same structure, a value of K keeps relatively stable and may be counted as a constant. It can be seen that the operating current of the light-emitting element 6 is not affected by the threshold voltage Vth of the driving transistor DN, which solves the drift of the threshold voltage Vth of the driving transistor DN caused by the process and long-term operation, thereby improving the display inhomogeneity of the display panel.

The technical solutions provided by the embodiments of the present disclosure may include the following beneficial effects.

In the pixel driving circuit provided by the embodiments of the present disclosure, a set of thin film transistors and a storage capacitor are integrated in the pixel circuit of each pixel, and a current flowing through the OLED is controlled by driving and controlling the thin film transistors and storage capacitor, thereby enabling the OLED to emit light according to practical requirements.

The pixel driving circuit provided by the embodiments of the present disclosure has simple control signals, saves wiring space, and solves the problem of poor display brightness uniformity of a display device in the relevant art caused by threshold voltage drift of a driving transistor.

It should be understood that an orientation or positional relationship indicated by terms such as "length", "width", "upper", "lower", "front", "rear", "left", "right", "vertical", "horizontal", "top", "bottom", "inner", "outer" is an orientation or positional relationship based on the drawings, and are only for the convenience of describing the present disclosure and simplifying the description, rather than indicating or implying that the described device or element must have a specific orientation, or must be constructed and operated in a specific orientation. Therefore the description about these terms cannot be regarded as a limitation of the present disclosure.

In addition, terms such as "first" and "second" are only used for descriptive purposes, and cannot be understood as indicating or implying relative importance or implicitly indicating the number of indicated technical features. The features defined with the terms such as "first" and "second" may explicitly or implicitly include one or more of these features. In the description of the present disclosure, "a plurality of" means two or more, unless otherwise specifically defined.

Unless otherwise defined, the technical and scientific terms used herein have the same meanings as commonly understood by those skilled in the technical field of the present disclosure. The terms used herein are only for describing specific implementation purposes, and are not intended to limit the present disclosure. Terms such as "arranging" appearing in this specification may mean that one component is directly attached to another component, or that one component is attached to another component through an intermediate component. A feature described in an embodiment herein can be applied to another embodiment alone or in combination with other features, unless the feature is not applicable in the other embodiment or otherwise stated.

The present disclosure has been described through the above-mentioned embodiments. It should be understood that the above-mentioned embodiments are only for the purpose of example and description, and are not intended to limit the present disclosure to the scope of the described embodiments. Those skilled in the art can understand that more variations and modifications can be made based on the teachings of the present disclosure, and these variations and modifications shall fall within the protection scope claimed by the present disclosure.

What is claimed is:

1. A pixel driving circuit, comprising a driving transistor, a storage sub-circuit, a data writing sub-circuit, an initialization sub-circuit, a first light-emission control sub-circuit, a second light-emission control sub-circuit and a light-emitting element, wherein:
the data writing sub-circuit is connected to a first electrode of the driving transistor, and is configured to write a data signal to the first electrode of the driving transistor in response to a second scan signal;
the storage sub-circuit is connected to a gate electrode of the driving transistor, a second electrode of the driving transistor and an initial voltage terminal, and is configured to store the data signal written by the data writing sub-circuit;
the initialization sub-circuit is connected to the initial voltage terminal and a first end of the light-emitting element, and is configured to apply a reset voltage of the initial voltage terminal to the light-emitting element in response to a first scan signal;
the first light-emission control sub-circuit is connected to the first electrode of the driving transistor and a first power terminal, and is configured to apply a voltage of the first power terminal to the first electrode of the driving transistor in response to a first light-emission signal;
the driving transistor is configured to generate a drive current in response to the data signal stored in the gate electrode of the driving transistor by the storage sub-circuit, and under action of the voltage applied to the first electrode of the driving transistor by the first light-emission control sub-circuit; and
the second light-emission control sub-circuit is connected to the second electrode of the driving transistor and the first end of the light-emitting element, and is configured to apply the drive current to the light-emitting element in response to a second light-emission signal, wherein a second end of the light-emitting element is connected to a second power terminal,
wherein the initial voltage terminal is configured to provide the reset voltage, the first power terminal is configured to provide a first power voltage, and the second power terminal is configured to provide a second power voltage.

2. The pixel driving circuit according to claim 1, wherein:
the storage sub-circuit includes a storage capacitor and a first transistor, a first end of the storage capacitor is connected to the gate electrode of the driving transistor, and a second end of the storage capacitor is connected to the initial voltage terminal; and
a gate electrode of the first transistor is connected to a first light-emission control line that provides the first light-emission signal, a first electrode of the first transistor is connected to the first end of the storage capacitor, and a second electrode of the first transistor is connected to the second electrode of the driving transistor.

3. The pixel driving circuit according to claim 1, wherein:
the data writing sub-circuit includes a second transistor, a gate electrode of the second transistor is connected to a second scan line that provides the second scan signal, a first electrode of the second transistor is connected to a data line that provides the data signal, and a second electrode of the second transistor is connected to the first electrode of the driving transistor.

4. The pixel driving circuit according to claim 1, wherein:
the initialization sub-circuit includes a third transistor, a gate electrode of the third transistor is connected to a first scan line that provides the first scan signal, a first electrode of the third transistor is connected to the initial voltage terminal to receive the reset voltage, and a second electrode of the third transistor is connected to the first end of the light-emitting element.

5. The pixel driving circuit according to claim 1, wherein:
the first light-emission control sub-circuit includes a fourth transistor, and the second light-emission control circuit includes a fifth transistor;
a gate electrode of the fourth transistor is connected to a first light-emission control line that provides the first light-emission signal, a first electrode of the fourth transistor is connected to the first power terminal, and a second electrode of the fourth transistor is connected to the first electrode of the driving transistor; and
a gate electrode of the fifth transistor is connected to a second light-emission control line that provides the second light-emission signal, a first electrode of the fifth transistor is connected to the second electrode of the driving transistor, and a second electrode of the fifth transistor is connected to the first end of the light-emitting element.

6. The pixel driving circuit according to claim 1, wherein:
the storage sub-circuit includes a storage capacitor and a first transistor, a first end of the storage capacitor is connected to the gate electrode of the driving transistor, and a second end of the storage capacitor is connected to the initial voltage terminal;
a gate electrode of the first transistor is connected to a first light-emission control line that provides the first light-emission signal, a first electrode of the first transistor is connected to the first end of the storage capacitor, and a second electrode of the first transistor is connected to the second electrode of the driving transistor;
the data writing sub-circuit includes a second transistor, a gate electrode of the second transistor is connected to a second scan line that provides the second scan signal, a first electrode of the second transistor is connected to a data line that provides the data signal, and a second electrode of the second transistor is connected to the first electrode of the driving transistor;
the initialization sub-circuit includes a third transistor, a gate electrode of the third transistor is connected to a first scan line that provides the first scan signal, a first electrode of the third transistor is connected to the initial voltage terminal to receive the reset voltage, and a second electrode of the third transistor is connected to the first end of the light-emitting element;
the first light-emission control sub-circuit includes a fourth transistor, and the second light-emission control circuit includes a fifth transistor; a gate electrode of the fourth transistor is connected to a first light-emission control line that provides the first light-emission signal, a first electrode of the fourth transistor is connected to the first power terminal, and a second electrode of the fourth transistor is connected to the first electrode of the driving transistor;
a gate electrode of the fifth transistor is connected to a second light-emission control line that provides the second light-emission signal, a first electrode of the fifth transistor is connected to the second electrode of the driving transistor, and a second electrode of the fifth transistor is connected to the first end of the light-emitting element;

the driving transistor, the second transistor, the third transistor, the fourth transistor and the fifth transistor are P-type transistors, and the first transistor is an N-type transistor.

7. The pixel driving circuit according to claim 2, wherein: the storage sub-circuit further comprises a sixth transistor, a gate electrode of the sixth transistor is connected to the first light-emission control line, a first electrode of the sixth transistor is connected to the second electrode of the first transistor, and a second electrode of the sixth transistor is connected to the second electrode of the driving transistor.

8. The pixel driving circuit according to claim 6, wherein: the storage sub-circuit further comprises a sixth transistor, a gate electrode of the sixth transistor is connected to the first light-emission control line, a first electrode of the sixth transistor is connected to the second electrode of the first transistor, and a second electrode of the sixth transistor is connected to the second electrode of the driving transistor.

9. The pixel driving circuit according to claim 8, wherein the sixth transistor is an N-type transistor.

10. The pixel driving circuit according to claim 2, wherein: the storage sub-circuit further comprises a sixth transistor, a gate electrode of the sixth transistor is connected to a first scan line that provides the first scan signal, a first electrode of the sixth transistor is connected to the second electrode of the first transistor, and a second electrode of the sixth transistor is connected to the second electrode of the driving transistor.

11. The pixel driving circuit according to claim 6, wherein: the storage sub-circuit further comprises a sixth transistor, a gate electrode of the sixth transistor is connected to a first scan line that provides the first scan signal, a first electrode of the sixth transistor is connected to the second electrode of the first transistor, and a second electrode of the sixth transistor is connected to the second electrode of the driving transistor.

12. The pixel driving circuit according to claim 11, wherein the sixth transistor is a P-type transistor.

13. The pixel driving circuit according to claim 2, wherein the first transistor is an indium gallium zinc oxide (IGZO) transistor.

14. The pixel driving circuit according to claim 6, wherein the first transistor is an indium gallium zinc oxide (IGZO) transistor.

15. The pixel driving circuit according to claim 6, wherein the first power terminal is inputted with a first DC (direct current) voltage, the second power terminal is inputted with a second DC voltage, and the second voltage is lower than the first voltage.

16. The pixel driving circuit according to claim 1, wherein the first power terminal is inputted with a first DC voltage, the second power terminal is inputted with a second DC voltage, and the second voltage is lower than the first voltage.

17. A driving method of a pixel driving circuit, applied to the pixel driving circuit according to claim 1, comprising: a reset phase, a data writing phase and a light-emitting phase:

in the reset phase, applying, by the initialization sub-circuit in response to the first scan signal, the reset voltage of the initial voltage terminal to the light-emitting element, to reset a voltage of the first end of the light-emitting element; and applying, by the storage sub-circuit in response to the first light-emission signal, the reset voltage to the gate electrode of the driving transistor, to reset a voltage of the gate electrode of the driving transistor;

in the data writing phase, writing, by the data writing sub-circuit in response to the second scan signal, the data signal into the first electrode of the driving transistor, the data signal being Vdata; controlling, by the storage sub-circuit in response to the first light-emission signal, a path between the second electrode and the gate electrode of the driving transistor to be electrically conducted, to enable a voltage of the gate electrode of the driving transistor to be Vdata+Vth and realize writing of the data signal into the storage sub-circuit, wherein Vth is a threshold voltage corresponding to the driving transistor; and in the light-emitting phase, applying, by the first light-emission control sub-circuit in response to the first light-emission signal, the voltage of the first power terminal to the first electrode of the driving transistor, and applying, by the second light-emission control sub-circuit in response to the second light-emission signal, the drive current to the light-emitting element, to drive the light-emitting element to emit light.

18. A driving method of a pixel driving circuit, applied to the pixel driving circuit according to claim 2, comprising: a reset phase, a data writing phase and a light-emitting phase:

in the reset phase, applying, by the initialization sub-circuit in response to the first scan signal, the reset voltage of the initial voltage terminal to the light-emitting element, to reset a voltage of the first end of the light-emitting element; and applying, by the storage sub-circuit in response to the first light-emission signal, the reset voltage to the gate electrode of the driving transistor, to reset a voltage of the gate electrode of the driving transistor;

in the data writing phase, writing, by the data writing sub-circuit in response to the second scan signal, the data signal into the first electrode of the driving transistor, the data signal being Vdata; controlling, by the storage sub-circuit in response to the first light-emission signal, a path between the second electrode and the gate electrode of the driving transistor to be electrically conducted, to enable a voltage of the gate electrode of the driving transistor to be Vdata+Vth and realize writing of the data signal into the storage sub-circuit, wherein Vth is a threshold voltage corresponding to the driving transistor; and in the light-emitting phase, applying, by the first light-emission control sub-circuit in response to the first light-emission signal, the voltage of the first power terminal to the first electrode of the driving transistor, and applying, by the second light-emission control sub-circuit in response to the second light-emission signal, the drive current to the light-emitting element, to drive the light-emitting element to emit light.

19. A display panel, comprising a plurality of pixel units arranged in an array, wherein each of the plurality of pixel units includes the pixel driving circuit according to claim 1.

20. The pixel driving circuit according to claim 2, wherein the second end of the storage capacitor is directly connected to the initial voltage terminal.

* * * * *